United States Patent
Joshi et al.

(10) Patent No.: US 8,842,435 B2
(45) Date of Patent: Sep. 23, 2014

(54) TWO-PHASE HEAT TRANSFER ASSEMBLIES AND POWER ELECTRONICS INCORPORATING THE SAME

(75) Inventors: Shailesh N. Joshi, Ann Arbor, MI (US); Ercan Mehmet Dede, Ann Arbor, MI (US)

(73) Assignee: Toyota Motor Engineering & Manufacturing North America, Inc., Erlanger, NY (US)

( * ) Notice: Subject to any disclaimer, the term of this patent is extended or adjusted under 35 U.S.C. 154(b) by 171 days.

(21) Appl. No.: 13/471,699

(22) Filed: May 15, 2012

(65) Prior Publication Data
US 2013/0308277 A1 Nov. 21, 2013

(51) Int. Cl.
*H05K 7/20* (2006.01)
*F28D 15/00* (2006.01)
*H01B 9/06* (2006.01)

(52) U.S. Cl.
USPC ............... 361/700; 165/104.33; 165/80.4; 165/80.5; 361/699

(58) Field of Classification Search
CPC ........... G06F 1/16–1/1654; G06F 1/1656; G06F 1/1662–1/1681; G06F 1/1684–1/189; G06F 1/20; G06F 1/203; G06F 1/206; G06F 2200/201; G06F 2200/202; G06F 2200/203; H05K 5/00; H05K 5/0026; H05K 5/0082; H05K 5/0021; H05K 5/0086–5/06; H05K 5/069; H05K 7/005–7/08; H05K 7/20; H05K 7/00; H05K 7/1422; H05K 1/0218–1/0219; H05K 1/00; H05K 3/00; H05K 9/00; H01G 2/00; H01G 4/00; H01G 5/00; H01G 7/00; H01G 9/00–9/155; H01G 11/00; H02G 3/00; H02G 5/00; H02G 7/00; H02G 9/00; H02G 11/00; H02G 13/00; H02G 15/00; H01B 7/00; H01B 11/00; H01B 17/00; H01R 4/00; H01R 9/00; H01R 13/00; H01K 1/00; H01K 3/00; H02B 1/00; H01H 37/00; F28F 2245/02; F28F 2245/04
USPC ............... 361/679.46–679.54, 688–723; 165/80.2–80.4, 104.26, 104.33; 174/15.1–15.2, 16.1–16.2; 62/64, 62/304–314; 257/714–716
See application file for complete search history.

(56) References Cited

U.S. PATENT DOCUMENTS 3,613,779 A 10/1971 Brown
4,434,844 A 3/1984 Sakitani et al.
(Continued)

OTHER PUBLICATIONS

Susan Daniel, Manoj K. Chaudhury, John C. Chen, "Fast Drop Movements Resulting From the Phase Change on a Gradient Surface", Science, vol. 291, Jan. 26, 2001.

*Primary Examiner* — Zachary M Pape
*Assistant Examiner* — Razmeen Gafur
(74) *Attorney, Agent, or Firm* — Dinsmore & Shohl LLP

(57) ABSTRACT

A two-phase heat transfer assembly includes a cold plate having an impingement surface, an array of heat generating device coupled to the cold plate, and an array of spray nozzles. The impingement surface has an array of central hydrophilic regions. Each individual central hydrophilic region is surrounded by a hydrophobic perimeter. A wettability of the impingement surface gradually progresses from hydrophilic at each individual central hydrophilic region to hydrophobic at each hydrophobic perimeter. The array of heat generating devices is coupled to a heated surface of the cold plate such that the array of central hydrophilic regions is aligned with the array of heat generating devices. The array of spray nozzles is configured to direct coolant droplets toward the impingement surface. The wettability profile of the impingement surface of the cold plate causes the coolant droplets to move inwardly toward the individual central hydrophilic regions from each hydrophobic perimeter.

20 Claims, 8 Drawing Sheets

(56) References Cited

U.S. PATENT DOCUMENTS

| | | | |
|---|---|---|---|
| 4,664,182 A * | 5/1987 | Miwa | 165/133 |
| 5,445,682 A * | 8/1995 | Hasegawa et al. | 148/241 |
| 5,514,248 A * | 5/1996 | Okuda et al. | 159/28.6 |
| 5,768,103 A * | 6/1998 | Kobrinetz et al. | 361/699 |
| 5,876,667 A | 3/1999 | Gremel et al. | |
| 6,245,854 B1 | 6/2001 | Obioha et al. | |
| 6,434,003 B1 * | 8/2002 | Roy et al. | 361/699 |
| 6,498,725 B2 * | 12/2002 | Cole et al. | 361/700 |
| 6,568,465 B1 * | 5/2003 | Meissner et al. | 165/133 |
| 7,060,329 B2 * | 6/2006 | Kelley et al. | 427/458 |
| 7,159,414 B2 * | 1/2007 | Tilton et al. | 62/304 |
| 7,658,968 B2 * | 2/2010 | Otter | 427/204 |
| 7,740,933 B2 * | 6/2010 | Kim et al. | 428/304.4 |
| 7,836,706 B2 * | 11/2010 | Tilton et al. | 62/64 |
| 7,874,347 B2 * | 1/2011 | Chen | 165/104.26 |
| 8,020,613 B2 | 9/2011 | Nakakubo | |
| 8,081,461 B2 * | 12/2011 | Campbell et al. | 361/700 |
| 8,391,008 B2 * | 3/2013 | Dede | 361/702 |
| 8,580,351 B2 * | 11/2013 | Haje et al. | 427/486 |
| 2002/0117293 A1 * | 8/2002 | Campbell | 165/133 |
| 2006/0157227 A1 | 7/2006 | Choi et al. | |
| 2006/0191671 A1 | 8/2006 | Boger et al. | |
| 2007/0251249 A1 | 11/2007 | Burk | |
| 2009/0242177 A1 | 10/2009 | Morioka et al. | |
| 2009/0314469 A1 | 12/2009 | Thomas et al. | |
| 2010/0018234 A1 | 1/2010 | Gillan et al. | |
| 2010/0034335 A1 * | 2/2010 | Varanasi et al. | 376/412 |
| 2010/0096113 A1 * | 4/2010 | Varanasi et al. | 165/133 |
| 2010/0096114 A1 | 4/2010 | Yoshida et al. | |
| 2011/0198059 A1 | 8/2011 | Gavillet et al. | |
| 2012/0063091 A1 * | 3/2012 | Dede et al. | 361/699 |

* cited by examiner

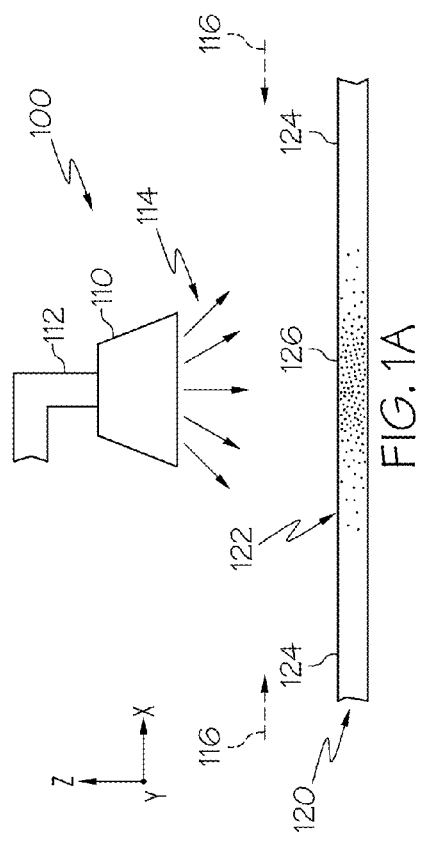
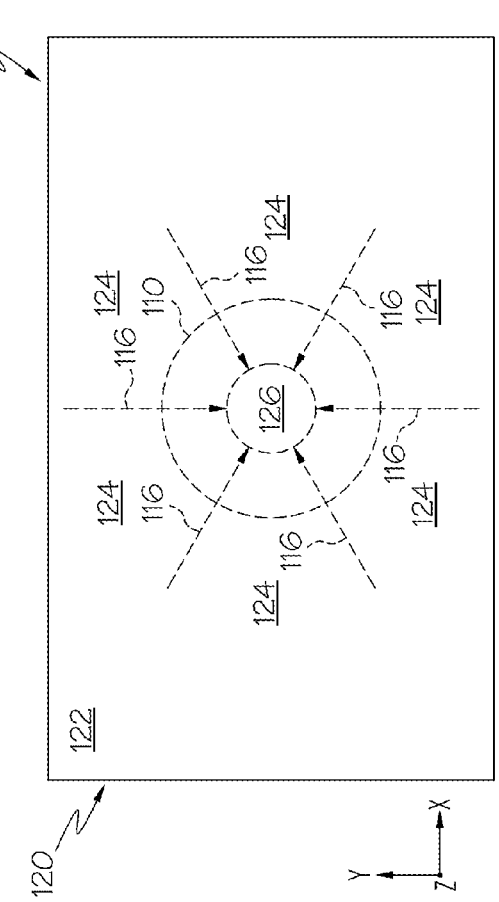

326'

TWO-PHASE HEAT TRANSFER ASSEMBLIES AND POWER ELECTRONICS INCORPORATING THE SAME

TECHNICAL FIELD

The present specification generally relates to two-phase heat transfer assemblies and, more particularly, to two-phase heat transfer assemblies and power electronics modules having a wettability profile for enhanced thermal transfer.

BACKGROUND

Heat transfer devices may be coupled to a heat generating device, such as a power electronics device, to remove heat and lower the maximum operating temperature of the heat generating device. Cooling fluid may be used in heat transfer devices to receive heat generated by the heat generating device by convective thermal transfer, and remove such heat from the heat generating device. Other heat transfer devices may remove thermal energy by two-phase heat transfer, wherein coolant fluid is converted from a liquid phase to a gas phase at the location of thermal flux.

However, as power electronic devices are designed to operate at increased power levels and generate increased corresponding heat flux due to the demands of newly developed electrical systems, conventional heat sinks are unable to adequately remove the heat flux to effectively lower the operating temperature of the power electronics to acceptable temperature levels.

Accordingly, a need exists for alternative heat transfer devices having enhanced thermal energy transfer.

SUMMARY

In one embodiment, a two-phase heat transfer assembly includes a cold plate having an impingement surface. The impingement surface includes a central hydrophilic region surrounded by a hydrophobic perimeter, wherein a wettability of the impingement surface gradually progresses from hydrophilic at the central hydrophilic region to hydrophobic at the hydrophobic perimeter, and the central hydrophilic region receives a heat flux from a heat generating device coupled to the cold plate. The two-phase heat transfer assembly further includes a spray nozzle configured to direct coolant droplets toward the impingement surface. The wettability of the impingement surface of the cold plate causes the coolant droplets to move inwardly toward the central hydrophilic region from the hydrophobic perimeter.

In another embodiment, a two-phase heat transfer assembly includes a cold plate having an impingement surface, an array of heat generating device coupled to the cold plate, and an array of spray nozzles. The impingement surface has an array of central hydrophilic regions, wherein each individual central hydrophilic region is surrounded by a hydrophobic perimeter, and a wettability of the impingement surface gradually progresses from hydrophilic at each individual central hydrophilic region to hydrophobic at each hydrophobic perimeter, thereby defining a wettability profile of the impingement surface. The array of heat generating devices is coupled to a heated surface of the cold plate such that the array of central hydrophilic regions is aligned with the array of heat generating devices. The array of spray nozzles is configured to direct coolant droplets toward the impingement surface. The wettability profile of the impingement surface of the cold plate causes the coolant droplets to move inwardly toward the individual central hydrophilic regions from each hydrophobic perimeter.

In yet another embodiment, a power electronics module includes a cold plate having an impingement surface, an array of semiconductor device coupled to the cold plate, and an array of spray nozzles. The impingement surface has an array of central hydrophilic regions, wherein each individual central hydrophilic region is surrounded by a hydrophobic perimeter, and a wettability of the impingement surface gradually progresses from hydrophilic at each individual central hydrophilic region to hydrophobic at each hydrophobic perimeter, thereby defining a wettability profile of the impingement surface. The array of semiconductor devices is coupled to a heated surface of the cold plate such that it is aligned with respect to the array of central hydrophilic regions. The array of semiconductor devices generates an array of hot spots at the array of central hydrophilic regions. The array of spray nozzles is configured to direct coolant droplets toward the impingement surface, wherein the wettability profile of the impingement surface of the cold plate causes the coolant droplets to move inwardly toward the individual central hydrophilic regions from each hydrophobic perimeter.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

FIG. 1A schematically depicts a side view of a two-phase heat transfer assembly comprising a cold plate and a spray nozzle according to one or more embodiments shown and described herein;

FIG. 1B schematically depicts a top view of the cold plate and spray nozzle depicted in FIG. 1A according to one or more embodiments shown and described herein;

DETAILED DESCRIPTION

Figure 1C:
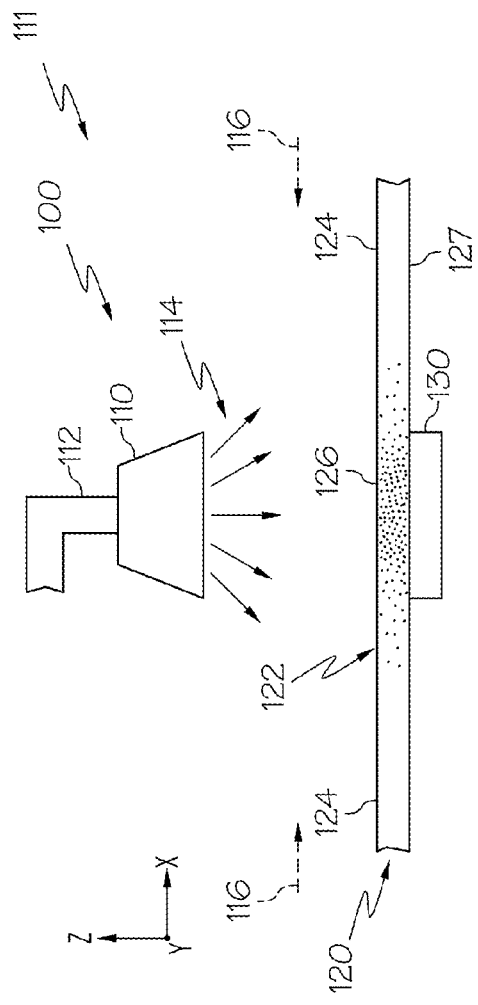
FIG. 1C schematically depicts a side view of a power electronics module comprising a two-phase heat transfer assembly and a power electronics device according to one or more embodiments shown and described herein.

FIG. 1B generally depicts one embodiment of a two-phase heat transfer assembly comprising a cold plate and a spray nozzle. The spray nozzle produces atomized droplets of coolant that impinge the impingement surface of the cold plate. The impingement surface comprises a central hydrophilic region that is centered about a hot spot that may be generated by a heat generating device. The wettability of the central hydrophilic region decreases gradually in a radial manner until becoming hydrophobic. Coolant droplets that are present on the impingement surface migrate toward the central hydrophilic region from the more hydrophobic regions due to the wettability gradient. Therefore, more coolant is present where the heat flux and thermal energy is at a maximum, thus improving cooling efficiency by two-phase heat transfer. As described in detail below, embodiments of the two-phase heat transfer assembly may be incorporated in power electronics modules or other systems that utilize two-phase heat transfer. Various embodiments of two-phase heat transfer assemblies and power electronics modules are described in detail below.

Referring now to FIG. 1A, a side view of a two-phase heat transfer assembly 100 is schematically illustrated. The two-phase heat transfer assembly 100 comprises a cold plate 120 and a spray nozzle 110. The spray nozzle 110 is fluidly coupled to a fluid line 112 that is fluidly coupled to a coolant source (not shown). The spray nozzle 110 is configured to spray atomized coolant droplets (indicated by arrows 114) toward an impingement surface 122 of the cold plate 120 such that the coolant droplets impinge the impingement surface 122. The coolant droplets may be any liquid capable of providing two-phase heat transfer and may include, but is not limited to, deionized water and engineered fluids, such as HFE-7100. The cold plate 120 is cooled by the boiling of coolant on the impingement surface 122 (i.e., two-phase heat transfer). The cold plate 120 may be made of any thermally conductive material. Exemplary materials for the cold plate 120 include, but are not limited to, aluminum and copper.

The impingement surface 122 comprises at least one central hydrophilic region 126 having a relatively high wettability. The wettability profile of the impingement surface 122 gradually transitions from hydrophilic at the central hydrophilic region 126 to hydrophobic at a hydrophobic perimeter 124 (i.e., regions of the impingement surface that are outside of a central hydrophilic region 126). As described in more detail below, the wettability may change continuously or discretely.

Figure 2:
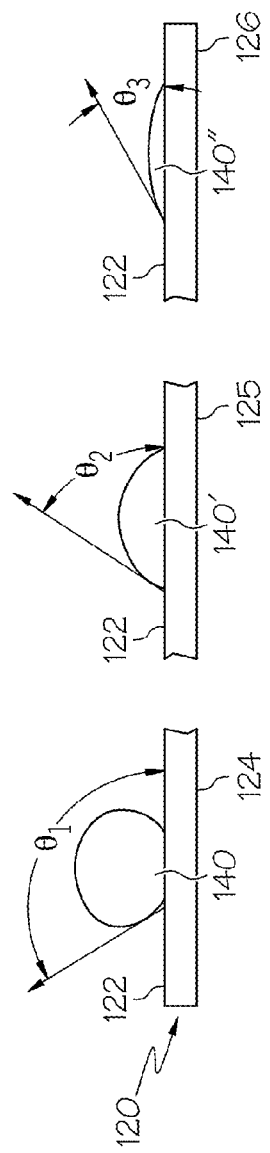
FIG. 2 schematically depicts the contact angle of a coolant droplet at three locations on an impingement surface of a cold plate according to one or more embodiments shown and described herein.
Figure 3A:
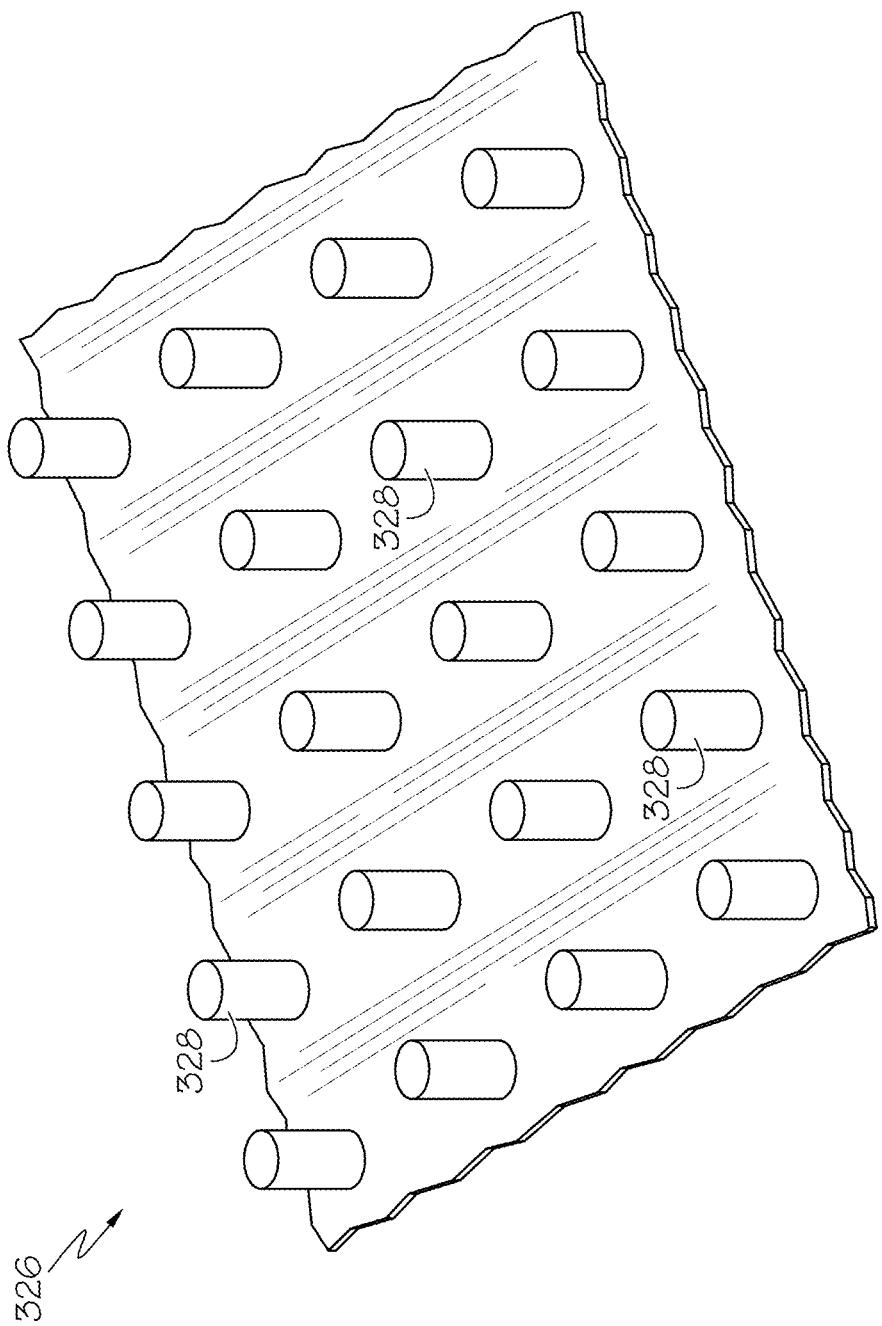
FIG. 3A schematically depicts pillar structures of a central hydrophilic region on an impingement surface of a cold plate according to one or more embodiments shown and described herein.
Figure 3B:
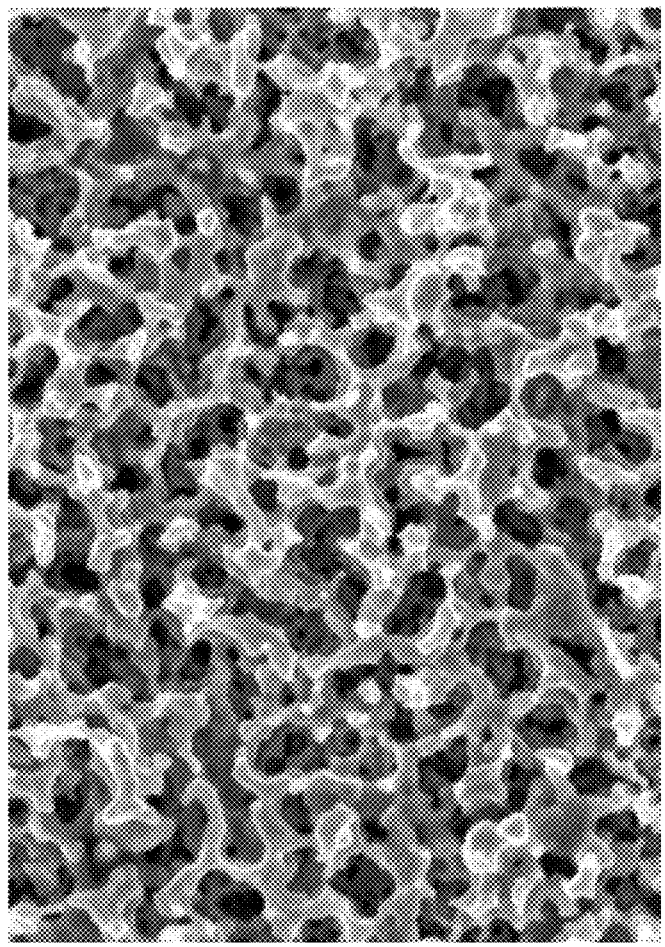
FIG. 3B schematically depicts a porous surface of a central hydrophilic region on an impingement surface of a cold plate according to one or more embodiments shown and described herein.
Figure 3C:
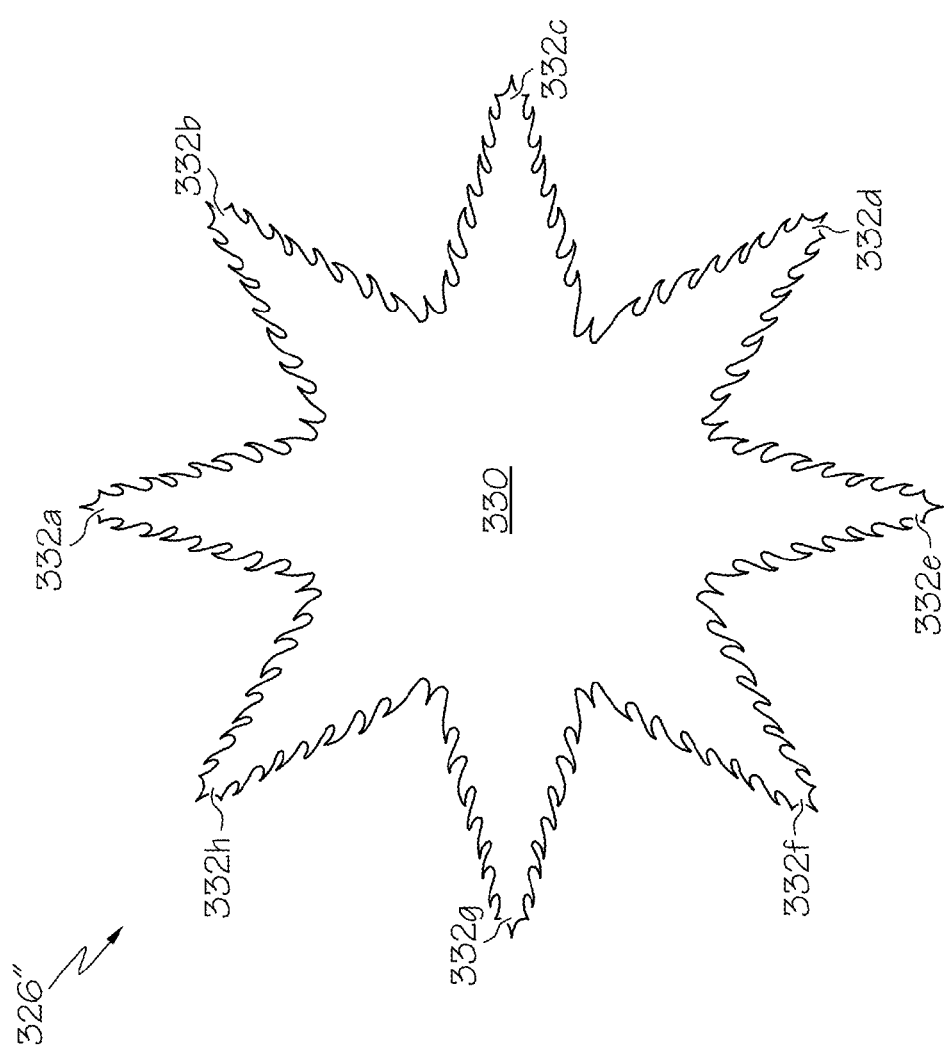
FIG. 3C schematically depicts a star-shaped central hydrophilic region on an impingement surface of a cold plate according to one or more embodiments shown and described herein.

Wettability is defined by the contact angle at which the liquid-vapor interface of a coolant droplet meets the solid-liquid interface of the coolant droplet. FIG. 2 schematically illustrates wettability at three positions on the impingement surface 122 of a cold plate 120. Starting from the left of FIG. 2, a coolant droplet 140 resting on the impingement surface in the hydrophobic perimeter 124 has a contact angle of $\theta_1$, which is greater than 90° and therefore indicative of a hydrophobic surface. Generally, contact angles that are greater than 90° provide a surface that is hydrophobic. The central portion of FIG. 2 depicts a coolant droplet 140' resting on the impingement surface 122 at a location 125 that is between the hydrophobic perimeter 124 and the central hydrophilic region 126. Accordingly, the coolant droplet 140' has a contact angle $\theta_2$ that is less than $\theta_1$. Finally, at the right side of FIG. 2, a coolant droplet 140" is depicted as having a low contact angle $\theta_3$ that is less than $\theta_2$. The contact angle $\theta_3$ at the central hydrophilic region 126 may be zero in some embodiments. Accordingly, the wettability transitions from hydrophilic at the central hydrophilic region 126 to hydrophobic at the hydrophobic perimeter 124. Exemplary structures for providing the wettability profile(s) are illustrated in FIGS. 3A-3C and described in detail below.

Referring now to FIG. 1B, a top view of the two-phase heat transfer assembly 100 depicted in FIG. 1A is schematically illustrated. The spray nozzle 110 in the illustrated embodiment is vertically aligned with respect to the central hydrophilic region 126 such that the coolant droplets 114 impinge the impingement surface at the central hydrophilic region 126. It is noted that, although the spray nozzle 110 is depicted as being larger than the central hydrophilic region 126, particular dimensions of the spray nozzle 110 and central hydrophilic region 126 illustrated in FIG. 1B (and throughout the figures) are not intended. For example, the central hydrophilic region 126 may be larger in diameter than the spray nozzle 110.

Droplets of liquid, such as water, self-migrate from a hydrophobic surface to a hydrophilic surface when the wettability profile changes gradually from hydrophobic to hydrophilic. Referring to both FIGS. 1A and 1B, the wettability profile of the impingement surface 122 causes the coolant droplets to migrate from the hydrophobic perimeter 124 to the central hydrophilic region 126 as indicated by arrows 116. In this manner, more liquid is available at the central hydrophilic region 126 for boiling and heat transfer, thereby enhancing thermal energy transfer.

The two-phase heat transfer assembly 100 may also be incorporated into a power electronics module 111. FIG. 1C depicts a power electronics module 111 comprising a power semiconductor device 130 (or other heat generating device in applications other than power electronics applications) is coupled to a heated surface 127 of the cold plate 120 that is opposite from the impingement surface 122. The power semiconductor device 130 is coupled to the heated surface 127 such that it is aligned with the central hydrophilic region 126 along the z-axis. Therefore, heat flux that is generated by the power semiconductor device 130 may be concentrated at the central hydrophilic region 126, which is the area to which the coolant droplets migrate. The power semiconductor device 130 may include, but not limited to, an IGBT, a power diode, a power MOSFET, and the like. The power electronics module 111 may be incorporated into larger power electronics systems, such as inverters for electric and hybrid-electric vehicles, for example.

There are many ways to achieve the wettability gradients described above to move coolant droplets to the one or more central hydrophilic regions 126. In some embodiments, the hydrophobic regions are formed on the impingement surface 122 first followed by the formation of the central hydrophilic regions and the wettability gradients therebetween. In other embodiments, the hydrophilic regions are formed on the impingement surface 122 first followed by the formation of the hydrophobic regions and the wettability gradients therebetween.

The hydrophobic regions may be formed by a variety of techniques. For example, the impingement surface 122 of the cold plate 120 may be made of an inherently hydrophobic material (e.g., diamond, ceramics, polymers, and the like) or may be treated to increase hydrophobicity by lowing the surface contact energy. The impingement surface 122 may be treated to increase hyrophobicity by currently known or yet-to-be-developed techniques that includes, but are not limited to, implantation of atoms, molecules, and ions known to reduce surface contact energy in a surface by diffusion or other implantation techniques. More particularly, the diffusion or implantation technique may be provided by nitriding and/or carburizing processes. The impingement surface 122 may also be provided with a coating to reduce contact surface energy, such as coatings that are chemically and/or structurally hydrophobic. Coatings such as hydrophobic coatings, fluorinated coatings and polymer coatings may be applied to the impingement surface 122. In some embodiments, the coating material may be applied by chemical vapor deposition or physical vapor deposition.

As described above, in some embodiments, the entire impingement surface 122 may be treated for hydrophobicity, or the cold plate 120 may be made of a material that is inherently hydrophobic. The wettability gradients described above may then be created by imparting patterned structures onto the hydrophobic impingement surface 122. The patterned structures yield high surface contact energy at the middle of the central hydrophilic region 126, and yield a gradual decrease in surface contact energy radially from the middle of the central hydrophilic region 126. These structures may be formed by chemical etching, for example, and may take on many different configurations.

FIG. 3A schematically depicts a central hydrophilic region 326 that is defined by an array of pillars 328 that act as capillaries to increase the surface contact energy at the central hydrophilic region 326, thereby providing a hydrophilic surface. The pillars 328 may be formed in the impingement surface 122 by a chemical etching process, for example. The hydrophilicity provided by the array of pillars may be varied by manipulating one or more parameters, such as pillar height h, diameter d, and/or the pillar density of the pillars 328. The diameter d of the pillars may be on the nanometer or micrometer scale. The capillary action provided by the pillars 328 pull the coolant droplets toward the impingement surface 122 and lower the contact angle $\theta$. The pillar properties (e.g., pillar height h, diameter d, and/or the pillar density) are altered to radially transition from hydrophilic at the central hydrophilic region 326 to hydrophobic.

FIG. 3B depicts a portion of a central hydrophilic region 326' that is defined by a porous surface. The porosity of the central hydrophilic region 326' is such that the surface contact energy is high in the middle of the central hydrophilic region 326', thereby providing a hydrophilic surface. The porosity may then decrease radially from the middle of the central hydrophilic region 326' to gradually transition the impingement surface 322 from hydrophilic to hydrophobic. The porosity of the central hydrophilic region 326' may be formed by chemical etching, by mechanical roughening, by laser ablation, or combinations thereof.

Referring now to FIG. 3C, a central hydrophilic region 326" of one embodiment is schematically illustrated. The illustrated central hydrophilic region 326" is configured as a star-shaped hydrophilic region having a plurality of hydrophilic arms 332a-332h extending from a hydrophilic center 330. The high wettability of the star-shaped hydrophilic region depicted in FIG. 3C may be established by the structures depicted in FIGS. 3A and 3B, or by use of a mask to prevent the central hydrophilic region 326" from being subjected to the hydrophobic material when the cold plate is treated for hydrophobicity. In one embodiment, the wettability within the star-shaped hydrophilic region is constant. In another embodiment, the wettability transitions from highly hydrophilic in the hydrophilic center 330 to less hydrophilic hydrophobic at the ends of the hydrophilic arms 332a-332h (i.e., the contact angle $\theta$ of coolant droplets is greater at the ends of the hydrophilic arms 332a-332h than in the hydrophilic center 330). The hydrophilic arms 332a-332h may act to transfer coolant droplets that are in the far away from the hydrophilic center 330 toward the heat flux.

Shapes other than the star-shaped central hydrophilic region 326" depicted in FIG. 3C are possible. For example, the central hydrophilic region may have more or fewer than eight arms, as well as arms of differing lengths and widths. The central hydrophilic region may also be configured as a snowflake-like shape, or as a fractal. The central hydrophilic region may also be configured as a plurality of radially extending, thin channels.

Figure 3D:
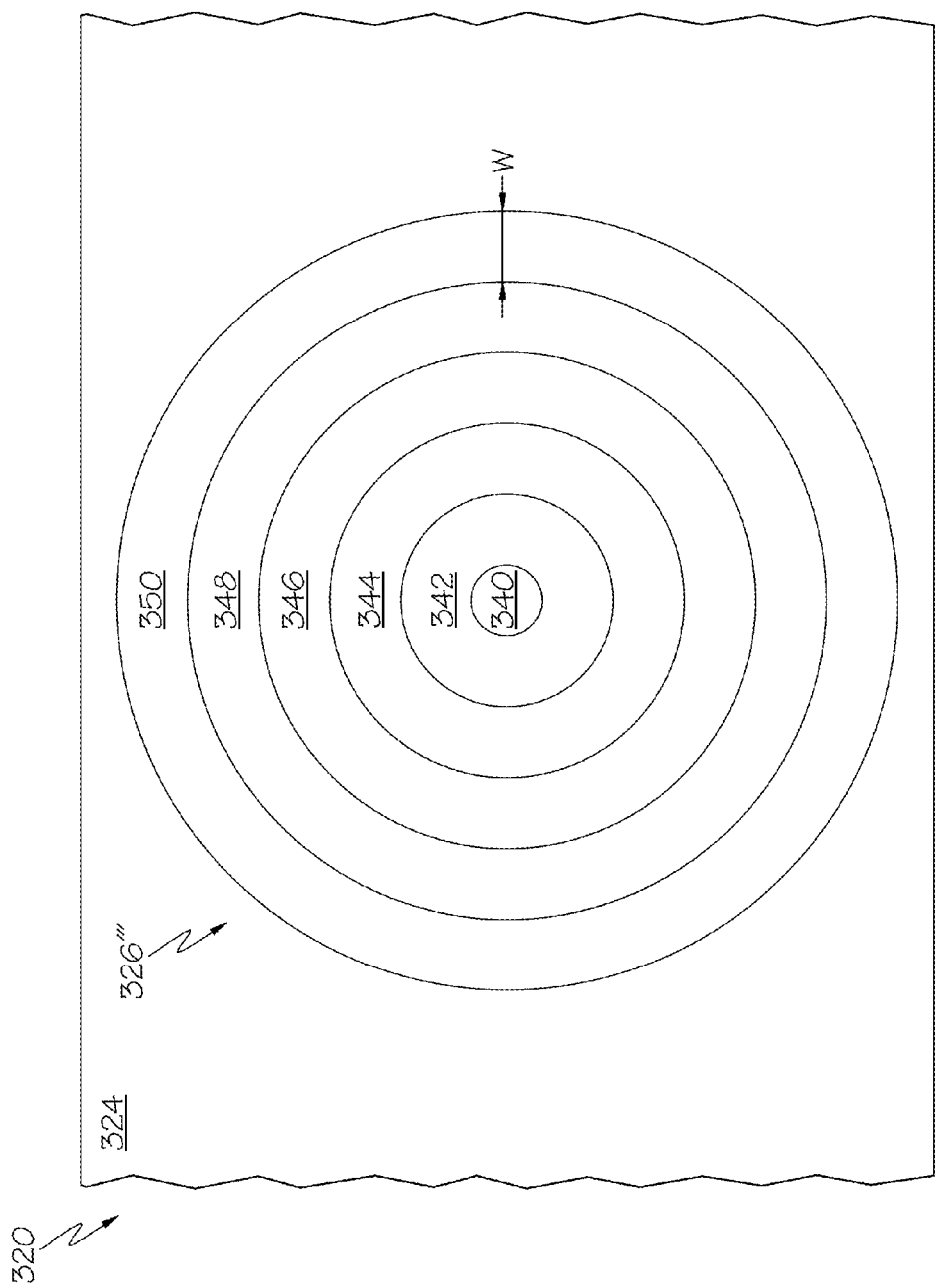
FIG. 3D schematically depicts a central hydrophilic region defined by concentric rings of differing wettability on an impingement surface of a cold plate according to one or more embodiments shown and described herein.

FIG. 3D depicts an embodiment wherein a central hydrophilic region 326''' is defined by a plurality of concentric rings 342-350 surrounding a highly hydrophilic central circle 340 in a cold plate 320. Each concentric ring 342-350 has a wettability that is less than the next radially inward concentric ring, with the highly hydrophilic central circle 340 having a wettability that is greater than each of the concentric rings 342-350. Accordingly, the wettability of the central hydrophilic region 326''' gradually transitions from highly hydrophilic at the highly hydrophilic central circle 340 to hydrophobic at the hydrophobic perimeter 324 in a discrete manner. Embodiments are not limited to any number of concentric rings. The width w of the concentric rings 342-350 may vary or be equal.

The concentric rings 342-350 and the highly hydrophilic central circle 340 may be imparted onto the impingement surface 322 by a variety of techniques. For example, the impingement surface 322 may be initially hydrophobic, and the concentric rings 342-350 may be formed by the creation of the structures described above with respect to FIGS. 3A and 3B. The configuration of the pillars or the porous surfaces of each concentric ring 342-350 may be designed to achieve the desired wettability such that the highly hydrophilic central circle 340 has the highest wettability and the outer-most concentric ring 350 has the lowest wettability of the central hydrophilic region 326'''. In another embodiment, the impingement surface 322 may be inherently hydrophilic and treated for hydrophobicity by a diffusion or implantation process. A plurality of masks may be applied to the central hydrophilic region 326''' to prevent a desired proportion of hydrophobic material from reaching the impingement surface 322, depending on the location within the central hydrophilic region 326'''. For example, a first circular mask may be applied and configured to cover a circular region defined by outer-most concentric ring 350, a second circular mask may be applied and configured to cover a circular region defined by concentric ring 348, and so on. The overlapping masks yield a step-wise wettability gradient, as each subsequent mask prevents move hydrophobic material from reaching the impingement surface 322. The masks coving the highly hydrophilic central circle 340 should be such that substantially zero hydrophobic material reaches the highly hydrophilic central circle 340

Although FIGS. 1A-1C depict only a single central hydrophilic region 126 and a single corresponding spray nozzle 110, embodiments are not limited thereto. For example, an array of central hydrophilic regions 126 and a corresponding array of spray nozzles 110 may be provided and aligned with respect to one another. Each spray nozzle 110 may direct coolant droplets 114 toward a corresponding central hydrophilic region 126. Further, an array of heat generating devices, such as power semiconductor devices, may be coupled to the heated surface 127 of the cold plate 120 and aligned with respect to the array of central hydrophilic regions 126.

Figure 4A:
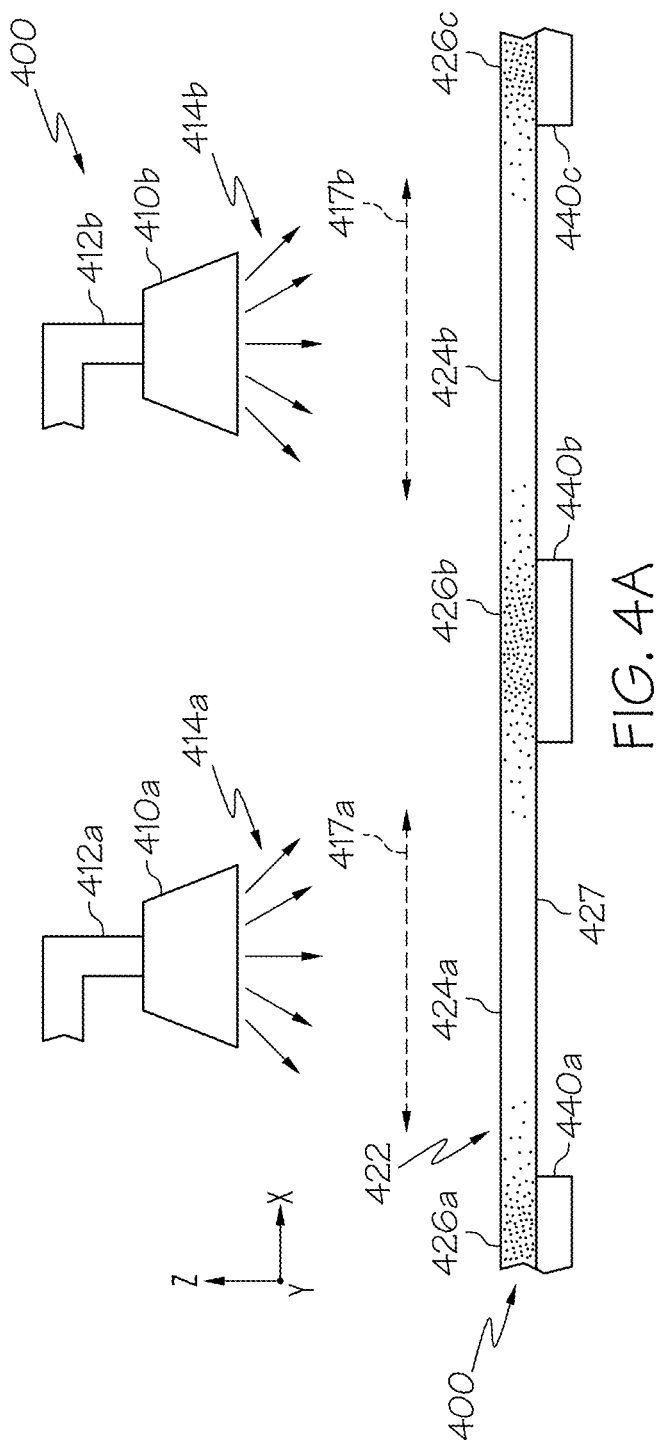
FIG. 4A schematically depicts a partial, side view of two-phase heat transfer assembly comprising an array of spray nozzles and an array of central hydrophilic regions according to one or more embodiments shown and described herein.
Figure 4B:
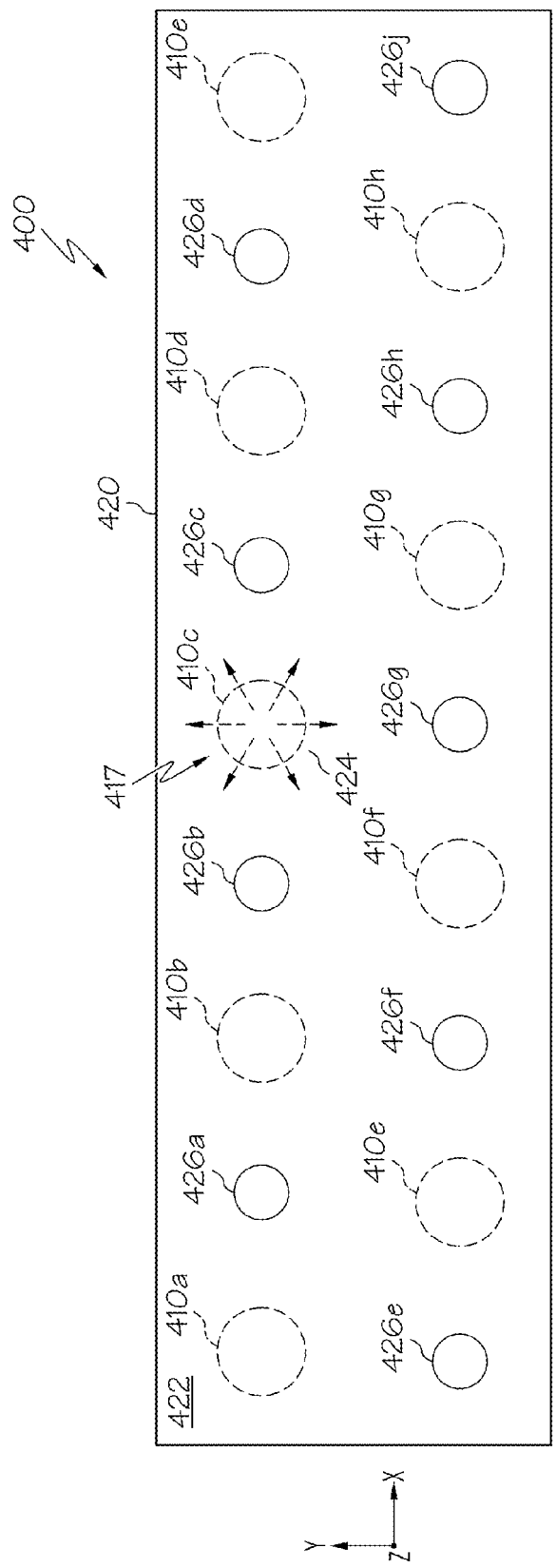
FIG. 4B schematically depicts a top view of a two-phase heat transfer assembly comprising an array of spray nozzles and an array of central hydrophilic regions according to one or more embodiments shown and described herein.

FIGS. 4A and 4B schematically depict an embodiment wherein the spray nozzle 410 is offset with respect to the central hydrophilic region 426 on an impingement surface 422 of a cold plate 420. In other words, the spray nozzle 410 is aligned with the hydrophobic perimeter 424 (or region). FIG. 4A is a side view of a portion of a power electronics module 400 having an array of spray nozzles (only spray nozzles 410a and 410b are shown in FIG. 4A), an array of central hydrophilic regions (only central hydrophilic regions 426a-426c are fully or partially shown in FIG. 4A), and an array of heat generating devices coupled to a heated surface 427 of the cold plate 420 (only heat generating devices 440a-440c are fully or partially shown in FIG. 4A). Any number of spray nozzles, central hydrophilic regions, and heat generating devices may be provided.

A first spray nozzle 410a is fluidly coupled to a first fluid line 412a, and is centered between a first central hydrophilic region 426a and a second central hydrophilic region 426b. The first spray nozzle 410a produces a first spray of coolant droplets 414a that impinges the impingement surface 422 between the first central hydrophilic region 426a and the second central hydrophilic region 426b at a first hydrophobic perimeter 424a. The coolant droplets may migrate toward the first and second central hydrophilic regions 426a and 426b as indicated by arrow 417a by both the momentum provided by striking the impingement surface 422 and the migratory effect provided by the wettability gradient between the first hydrophobic perimeter 424a and the first and second central hydrophilic regions 426a, 426b.

Similarly, a second spray nozzle 410b is fluidly coupled to a second fluid line 412b, and is centered between the second central hydrophilic region 426b and a third central hydrophilic region 426c. The second spray nozzle 410b produces a second spray of coolant droplets 414b that impinges the impingement surface 422 between the second central hydrophilic region 426b and the third central hydrophilic region 426c at a second hydrophobic perimeter 424b. The coolant droplets may migrate toward the second and third central hydrophilic regions 426b and 426c as indicated by arrow 417b by both the momentum provided by striking the impingement surface 422 and the migratory effect provided by the wettability gradient between the second hydrophobic perimeter 424b and the second and third central hydrophilic regions 426b, 426c. Additional spray nozzles provided in the power electronics module 400 may perform in the same manner.

FIG. 4B depicts a top view of a power electronic module 400 having an array of spray nozzles 410a-410h and an array of central hydrophilic regions 426a-426i. It should be understood that more or fewer rows and columns of spray nozzles and central hydrophilic regions may be provided, and embodiments are not limited to the configuration depicted in FIG. 4B. The spray nozzles 410a-410h are positioned between the central hydrophilic regions 426a-426i. The coolant droplet movement of spray nozzle 410c is depicted by arrows 417. The coolant droplets impinge the impingement surface 422 of the cold plate 420 at a hydrophobic region 424 between central hydrophilic regions 426b, 426c, and 426g. As shown by arrows 417, the coolant droplets travel from the hydrophobic region toward central hydrophilic regions 426b, 426c, and 426g because of the momentum after striking the impingement surface 422 and the wettability gradients provided between the hydrophobic region 424 and central hydrophilic regions 426b, 426c, and 426g. Accordingly, the amount of liquid present for two-phase heat transfer at each central hydrophilic region is increased.

It should now be understood that the embodiments described herein may be directed to two-phase heat transfer assemblies and power electronics devices that improve fluid motion on an impingement surface and enhance thermal energy transfer by wettability gradients that cause coolant droplets to migrate toward a central hydrophilic region having a high heat flux. Each central hydrophilic region has a wettability gradient that changes radially from highly hydrophilic at a central portion to highly hydrophobic at a hydrophobic perimeter. Power electronic devices may include a power semiconductor device that is coupled to a heated surface of a cold plate that and is opposite from a central hydrophilic region on an impingement surface of the cold plate such that coolant droplets migrate toward a location on the impingement surface having the greatest heat flux. In this manner, thermal energy transfer is enhanced.

It is noted that the term "substantially" may be utilized herein to represent the inherent degree of uncertainty that may be attributed to any quantitative comparison, value, measurement, or other representation. This term is also utilized herein to represent the degree by which a quantitative representation may vary from a stated reference without resulting in a change in the basic function of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A two-phase heat transfer assembly comprising:
 a cold plate comprising an impingement surface, the impingement surface comprising a central hydrophilic region surrounded by a hydrophobic perimeter, wherein a wettability of the impingement surface gradually progresses from hydrophilic at the central hydrophilic region to hydrophobic at the hydrophobic perimeter, and the central hydrophilic region receives a heat flux from a heat generating device coupled to the cold plate; and
 a spray nozzle configured to direct coolant droplets toward the impingement surface, wherein the wettability of the impingement surface of the cold plate causes the coolant droplets to move inwardly toward the central hydrophilic region from the hydrophobic perimeter.

2. The two-phase heat transfer assembly of claim 1, wherein the cold plate comprises a heated surface opposite from the impingement surface, and the heat generating device is coupled to the heated surface opposite from the central hydrophilic region such that the heat generating device creates a hot spot at the central hydrophilic region.

3. The two-phase heat transfer assembly of claim 1, wherein the heat generating device comprises a power semiconductor.

4. The two-phase heat transfer assembly of claim 1, wherein the spray nozzle is aligned with respect to the central hydrophilic region.

5. The two-phase heat transfer assembly of claim 1, wherein the spray nozzle is offset with respect to the central hydrophilic region.

6. The two-phase heat transfer assembly of claim 1, wherein the spray nozzle is aligned with at least a portion of the hydrophobic perimeter.

7. The two-phase heat transfer assembly of claim 1, wherein the central hydrophilic region comprises an array of pillars configured such that the impingement surface gradually progresses from hydrophilic at the central hydrophilic region to hydrophobic at the hydrophobic perimeter.

8. The two-phase heat transfer assembly of claim 1, wherein each central hydrophilic region comprises a plurality of concentric rings progressing from hydrophilic at a central hydrophilic circle to hydrophobic at a perimeter of the plurality of concentric rings.

9. The two-phase heat transfer assembly of claim 1, wherein the central hydrophilic region comprises a hydrophilic center portion and a plurality of hydrophilic arms radially extending from the hydrophilic center portion.

10. The two-phase heat transfer assembly of claim 1, wherein the coolant droplets change phase from a liquid phase to a vapor phase at the central hydrophilic region.

11. A two-phase heat transfer assembly comprising:
  a cold plate comprising an impingement surface, the impingement surface comprising an array of central hydrophilic regions, wherein each individual central hydrophilic region is surrounded by a hydrophobic perimeter, and a wettability of the impingement surface gradually progresses from hydrophilic at each individual central hydrophilic region to hydrophobic at each hydrophobic perimeter, thereby defining a wettability profile of the impingement surface;
  an array of heat generating devices coupled to a heated surface of the cold plate such that the array of central hydrophilic regions is aligned with the array of heat generating devices; and
  an array of spray nozzles configured to direct coolant droplets toward the impingement surface, wherein the wettability profile of the impingement surface of the cold plate causes the coolant droplets to move inwardly toward the individual central hydrophilic regions from each hydrophobic perimeter.

12. The two-phase heat transfer assembly of claim 11, wherein each individual central hydrophilic region of the array of central hydrophilic regions receives a heat flux.

13. The two-phase heat transfer assembly of claim 11, wherein each heat generating device of the array of heat generating devices comprises a power semiconductor.

14. The two-phase heat transfer assembly of claim 11, wherein each individual spray nozzle of the array of spray nozzles is aligned with respect to an individual central hydrophilic region of the array of central hydrophilic regions.

15. The two-phase heat transfer assembly of claim 11, wherein the array of spray nozzles is offset with respect to the array of central hydrophilic regions.

16. The two-phase heat transfer assembly of claim 11, wherein each spray nozzle of the array of spray nozzles is aligned with at least a portion of a hydrophobic perimeter.

17. The two-phase heat transfer assembly of claim 11, wherein each central hydrophilic region comprises an array of pillars configured such that the impingement surface gradually progresses from hydrophilic at the central hydrophilic region to hydrophobic at the hydrophobic perimeter.

18. The two-phase heat transfer assembly of claim 11, wherein each central hydrophilic region comprises a plurality of concentric rings progressing from hydrophilic at a central hydrophilic circle to hydrophobic at a perimeter of the plurality of concentric rings.

19. The two-phase heat transfer assembly of claim 11, wherein each central hydrophilic region comprises a hydrophilic center portion and a plurality of hydrophilic arms radially extending from the hydrophilic center portion.

20. A power electronics module comprising:
  a cold plate comprising an impingement surface and a heated surface, the impingement surface comprising an array of central hydrophilic regions, wherein each individual central hydrophilic region is surrounded by a hydrophobic perimeter, and a wettability of the impingement surface gradually progresses from hydrophilic at each individual central hydrophilic region to hydrophobic at each hydrophobic perimeter, thereby defining a wettability profile of the impingement surface;
  an array of semiconductor devices coupled to the heated surface of the cold plate and aligned with respect to the array of central hydrophilic regions such that the array of semiconductor devices generate an array of hot spots at the array of central hydrophilic regions; and
  an array of spray nozzles configured to direct coolant droplets toward the impingement surface, wherein the wettability profile of the impingement surface of the cold plate causes the coolant droplets to move inwardly toward the individual central hydrophilic regions from each hydrophobic perimeter.

* * * * *